United States Patent
Hirosawa et al.

(10) Patent No.: US 9,768,563 B2
(45) Date of Patent: Sep. 19, 2017

(54) ELECTRONIC APPARATUS

(71) Applicant: KABUSHIKI KAISHA TOSHIBA, Minato-ku, Tokyo (JP)

(72) Inventors: Hideki Hirosawa, Gumma (JP); Yutaka Horie, Tokyo (JP); Akio Kanou, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/801,104

(22) Filed: Jul. 16, 2015

(65) Prior Publication Data

US 2016/0111830 A1  Apr. 21, 2016

Related U.S. Application Data

(60) Provisional application No. 62/064,871, filed on Oct. 16, 2014.

(51) Int. Cl.
*H01R 3/00* (2006.01)
*H01R 13/66* (2006.01)
*G01R 19/145* (2006.01)

(52) U.S. Cl.
CPC ....... *H01R 13/6683* (2013.01); *G01R 19/145* (2013.01); *H01R 2201/06* (2013.01)

(58) Field of Classification Search
CPC ............ H01R 13/6683; H01R 13/7175; H01R 2201/06; G01R 19/145
USPC .................................................. 439/488–490
See application file for complete search history.

(56) References Cited

U.S. PATENT DOCUMENTS

| 8,290,380 B2 | 10/2012 | Nishimura et al. |
| 2013/0086397 A1 | 4/2013 | Uchida |

FOREIGN PATENT DOCUMENTS

| JP | 2011-027960 A | 2/2011 |
| JP | 2013-080523 A | 5/2013 |

*Primary Examiner* — Khiem Nguyen
(74) *Attorney, Agent, or Firm* — Foley & Lardner LLP

(57) ABSTRACT

According to one embodiment, an electronic apparatus connectable to an external apparatus includes a first connector and a detector. The first connecter is electrically connected to a second connector of the external apparatus. Each of the first connector and the second connecter includes a plurality of terminals. The detector is configured to detect a state of a first terminal of the first connector. The first terminal of the first connector is configured to be set to a predetermined state via at least a connection line connecting two terminals of the second connector to each other while the first connector and the second connector are electrically connected to each other.

6 Claims, 15 Drawing Sheets

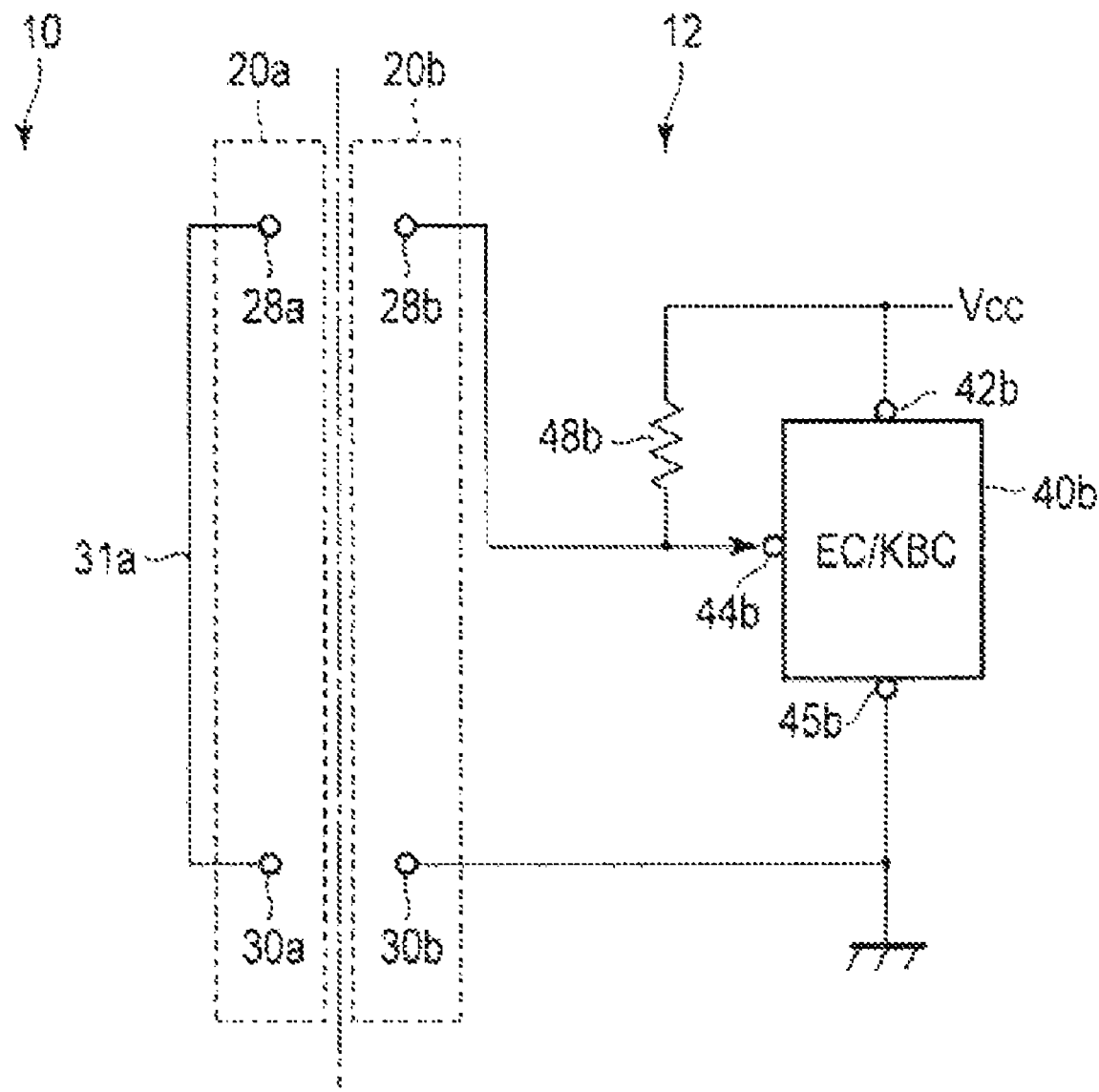
F I G. 3

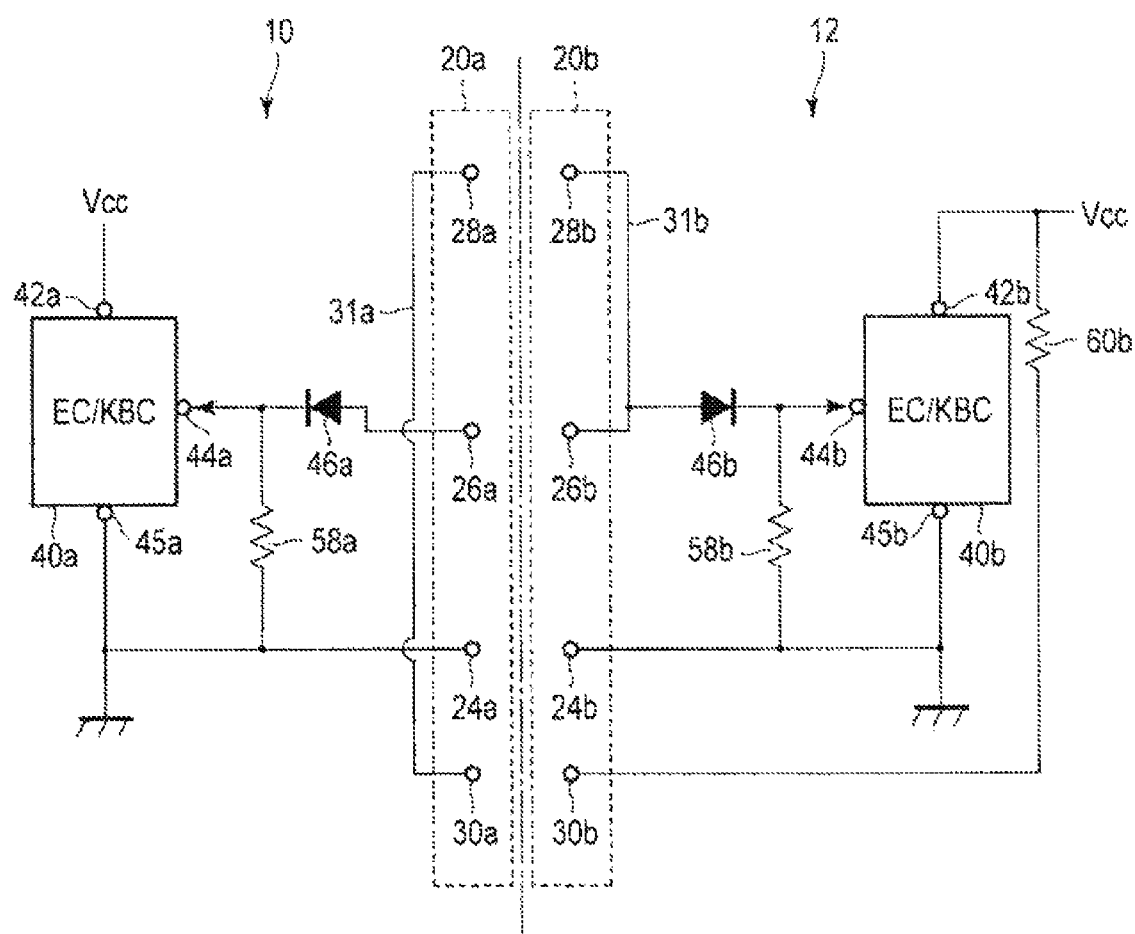
F I G. 8

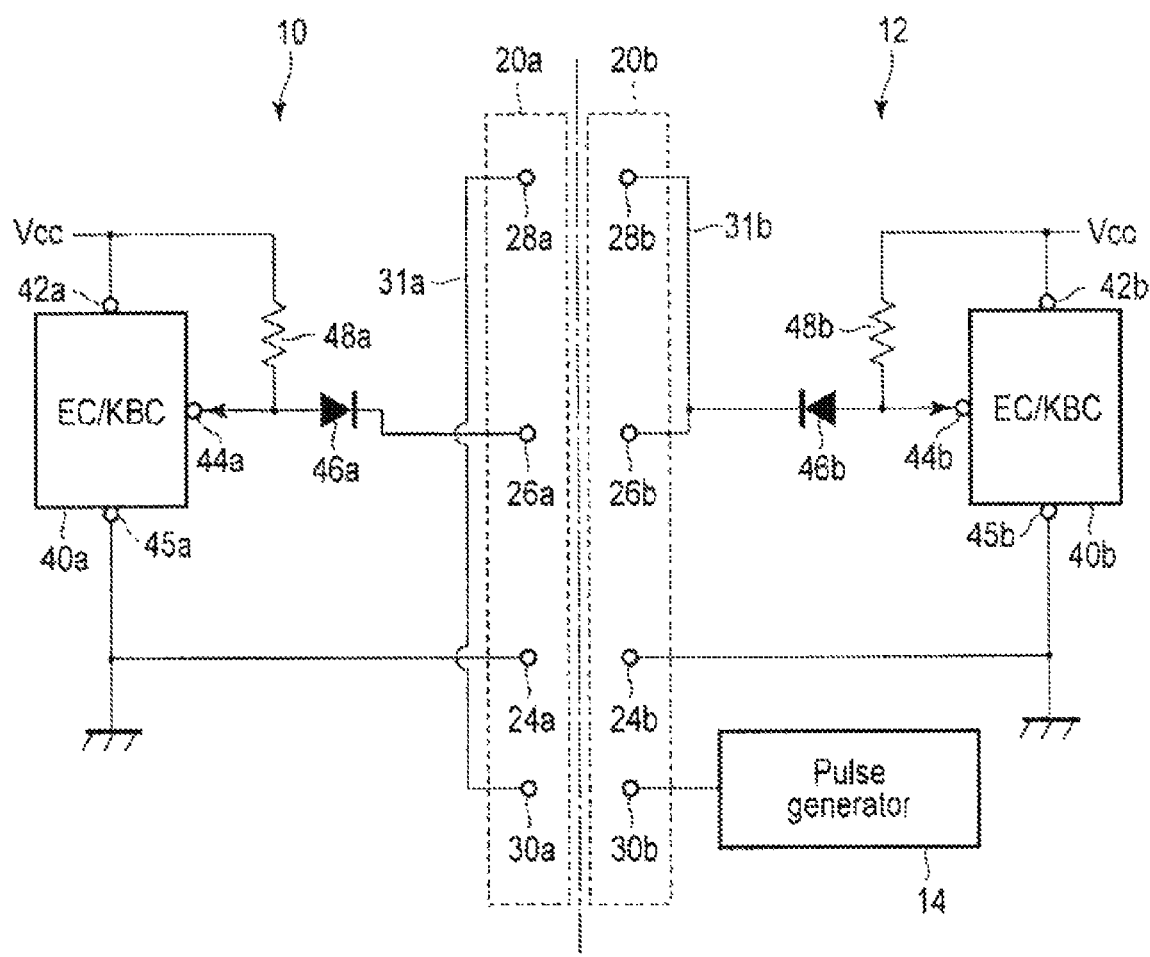
F I G. 14

ELECTRONIC APPARATUS

CROSS-REFERENCE TO RELATED APPLICATIONS

This application claims the benefit of U.S. Provisional Application No. 62/064,871, filed Oct. 16, 2014, the entire contents of which are incorporated herein by reference.

FIELD

Embodiments described herein related generally to connection detection of two electronic apparatuses.

BACKGROUND

Recently, two electronic apparatuses are often used while being connected to each other. For example, a table computer (hereinafter referred to as a tablet) is often connected to a keyboard. Various applications can be activated on the tablet and various buttons on an interface screen of the applications can be selected by touch operations. Of course, a software keyboard can be displayed on the screen of the tablet and characters can be input by touching the keyboard. However, some users prefer to input characters by means of a physical keyboard. Therefore, keyboard docks are sold separately. A keyboard dock includes a connector to which a tablet is connected, and a mechanism which maintains the state of the tablet connected to the connector. If the tablet is secured to the keyboard dock, the tablet can be used like a note PC.

In order to use the tablet by connecting the tablet to the keyboard dock, a connection between the tablet and the keyboard dock should be detected. The connection is generally detected by transmitting a signal for confirmation of connection from one apparatus to the other apparatus via a specific terminal.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 3 is a circuit diagram showing a modified embodiment of the connection detection circuit of the embodiment.

FIG. 8 is a circuit diagram showing yet another modified embodiment of the connection detection circuit of the embodiment.

FIG. 14 is a circuit diagram showing yet another modified embodiment of the connection detection circuit of the embodiment.

DETAILED DESCRIPTION

Various embodiments will be described hereinafter with reference to the accompanying drawings.

In general, according to one embodiment, an electronic apparatus connectable to on external apparatus includes a firm connector and a detector. The first connector is electrically connected to a second connector of the external apparatus. Each of the first connector and the second connector includes a plurality of terminals. The detector is configured to detect a state of a first terminal of the first connector. The first terminal of the first connecter is configured to be set to a predetermined state via at least a connection line connecting two terminals of the second connector to each other while the first connector and the second connector are electrically connected to each other.

Figure 1:
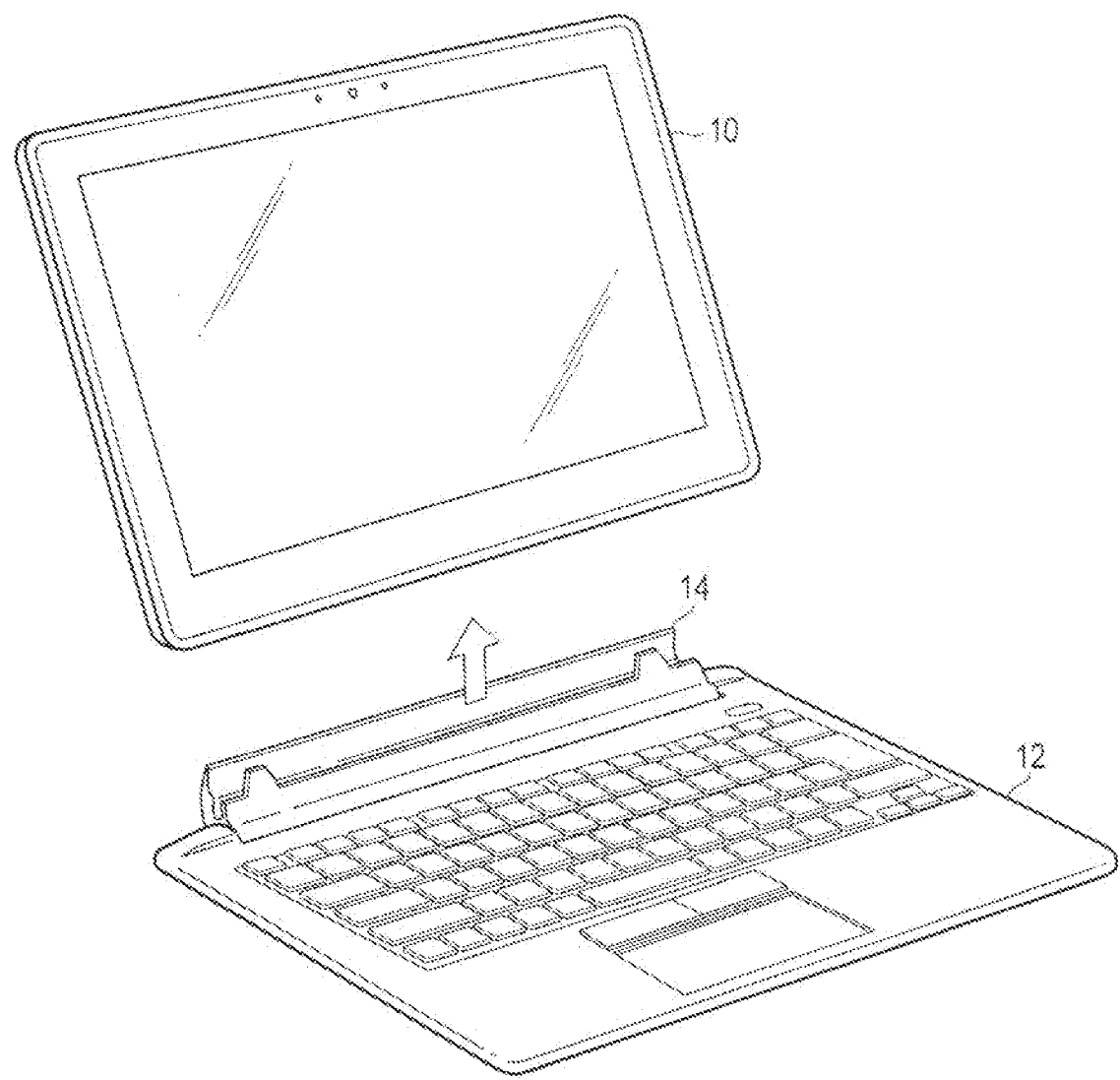
FIG. 1 is a perspective illustration showing an example of electronic apparatuses of an embodiment.

FIG. 1 is a perspective illustration showing a structural example of electronic apparatuses of an embodiment. Two electronic apparatuses connected to each other are a tablet 10 which is capable of touch operation and is not equipped with a hardware keyboard, and a keyboard dock 12. The keyboard dock 12 includes a support 14 which secures the tablet 10 at a predetermined angle at the back end. A docking port is provided in a predetermined position (for example, in the central region, or in two positions at the right and left ends) on the undersurface of the tablet 10. A docking connector is provided at the back end of the keyboard dock 12 corresponding to the docking port when the tablet 10 is inserted in the support 14. When the docking connector is provided at the center, the docking connector is provided in the support 14. The docking connector has a plug shape including pins, and the docking port has a receptacle shape which accepts the pins. Therefore, when the support 14 is attached to the tablet 10, the docking port and the docking connector are connected to each other, and a state where a notebook PC is opened is realized. The support 14 may have a hinge mechanism to allow the tablet 10 to be closed while inserted into the support 14.

The tablet 10 is powered by an internal battery and the keyboard dock 12 is powered by the commercial power supply. The tablet 10 is equipped with a wireless LAN circuit, but does not include a wired LAN connector, an HDMI output terminal or an RGB connector. The keyboard dock 12 includes a wired LAN connector, an HDMI output terminal and an RGB connector, which the tablet 10 does not include. When the docking port of the tablet 10 is attached to the docking connector of the keyboard dock 12, the tablet 10 and the keyboard dock 12 operate electrically as a unit. For example, the tablet 10 can be powered by the power supply from the keyboard dock 12 and can use the wired LAN connector, the HDMI output terminal and the RGB connector of the keyboard dock 12. An input signal of the keyboard dock 12 is transmitted to the tablet 10.

The two apparatuses are often synchronized with each other to operate integrally. To synchronize the apparatuses, a connection between the apparatuses must be detected. One apparatus transmits a connection detection signal to the other apparatus and prompts the other apparatus to start operation in the connected state when the connection of the other apparatus is detected. The apparatuses may mutually detect the connection of the other apparatus. After the connection detection, it is determined whether the other apparatus is a valid apparatus, etc.

Figure 2:
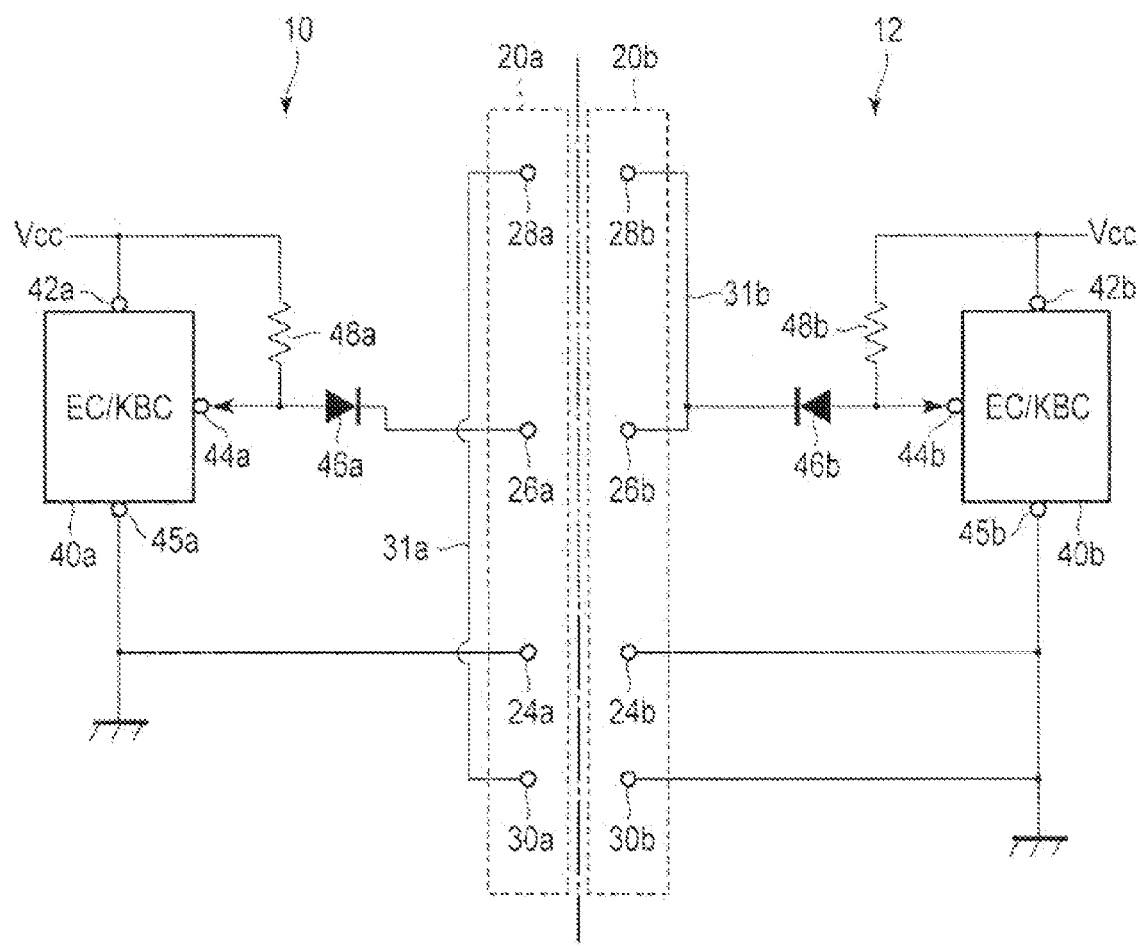
FIG. 2 is a circuit diagram showing an example of a configuration of a connection detection circuit of the embodiment.

FIG. 2 is a circuit diagram showing an example of a configuration of a circuit which detects the connection between the tablet 10 and the keyboard dock 12.

One of the tablet 10 and the keyboard dock 12, for example, the tablet 10, includes a docking port 20a and a circuit 40a for connection detection. The connection detection circuit 40a only needs to have a function of determining a level of a terminal. In the embodiment, an embedded controller/keyboard controller (hereinafter referred to as an EG/KBC) for power-supply control of the PC is used as an example of the circuit 40a. The docking port 20a includes a ground terminal 24a, a detection terminal 26a, a first relay terminal 28a and a second relay terminal 30a. The EC/KBC 40a includes a power supply terminal 42a, a connection detection terminal 44a and a ground terminal 45a. A power supply Vcc produced by the internal battery of the tablet 10 is connected to the power supply terminal 42a. The ground terminals 24a and 45a are grounded in the tablet 10. The detection terminal 44a or the EC/KBC 40a is connected to the power supply Vcc via a pull-up resistor 48a, and connected to the detection terminal 26a of one docking port 20a via a diode 46a for reverse-current prevention. The first relay terminal 28a is connected to the second relay terminal 30a via a connection line 31a.

The other one of the tablet 10 and the keyboard dock 12, for example, the keyboard dock 12, includes a docking connector 20b and an EC/KBC 40b. The docking connector 20b includes a ground terminal 24b, a detection terminal 26b, a first relay terminal 28b and a second relay terminal 30b. The EC/KBC 40b basically has the same structure as the EC/KBC 40a, and includes a power supply terminal 42b, a connection detection terminal 44b and a ground terminal 45b. A power supply Vcc of the keyboard dock 12 produced by the commercial power supply is connected to the power supply terminal 42b. The ground terminals 24b and 45b are grounded in the keyboard dock 12. The second relay terminal 30b can be connected to a known level, a signal source, etc., for connection detection, and is grounded in FIG. 2. The detection terminal 44b of the EC/KBC 40b is connected to the power supply Vcc via a pull-up resistor 48b, and connected to the detection terminal 26b of the docking connector 20b via a diode 46b for reverse-current prevention. The first relay terminal 28b is connected to the connection detection terminal 26b via a connection line 31b.

When the tablet 10 is inserted into the support 14 in a normal position, and the docking connector 20b and the docking port 20a are connected to each other, the terminals 24b, 26b, 28b and 30b of the docking connector 20b are connected to the terminals 24a, 26a, 28a and 30a of the docking port 20a, respectively, as shown in FIG. 2.

The arrangement of the terminals is not limited to the embodiment shown in FIG. 2. However, if the first relay terminals 28a and 28b and the second relay terminals 30a and 30b are arranged to be as far from each other as possible, for example, positioned at both ends, the following effect can be achieved. If the tablet 10 is obliquely attached to the support 14 of the keyboard dock 12, there is a possibility that the terminals are connected to each other and the connection is detected. However, if the terminals are arranged as shown in FIG. 2, the corresponding terminals are not connected to each other and the connection detection cannot be executed when the tablet 10 is obliquely attached to the support 14 of the keyboard dock 12. Therefore, erroneously executing the connection detection even though the tablet 10 is not attached correctly can be prevented. Similarly, false detection can be also prevented if the connection detection terminals 26a and 26b are arranged far from the first relay terminals 28a and 28b, for example, arranged near the second relay terminals 30a and 30b.

The docking port 20a and the docking connector 20b actually have terminals to transmit signals, control signals, etc., other than the above-described terminals, which, for convenience of description, are not shown in the drawings.

According to the circuit connected as shown in FIG. 2, the EC/KBC 40a and the EC/KBC 40b determine that the tablet 10 (the docking port 20a thereof) and the keyboard dock 12 (the docking connector 20b thereof) are connected correctly to each other (in other words, all the corresponding terminals are connected to each other) if the connection detection terminals 44a and 44b are at ground level. The EC/KBC 40a and the EC/KBC 40b determines that the tablet 10 and the keyboard dock 12 are not connected to each other if the detection terminals 44a and 44b are at a level other than ground level.

That is, if the corresponding terminals of the docking port 20a and the docking connector 20b are connected correctly to each other, the connection detection terminal 44a of the EC/KBC 40a of the tablet 10 is grounded in the keyboard dock 12 via the circuit constituted by the connection detection terminals 26a and 26b, the connection line 31b, the first relay terminals 28b and 28a, the connection line 31a and the second relay terminals 30a and 30b. If the corresponding terminals of the docking port 20a and the docking connector 20b are not connected to each other, the above circuit is not formed and the connection detection terminal 44a of the EC/KBC 40a of the tablet 10 is pulled up to the power supply Vcc via the resistor 48a. Therefore, the connection detection terminal 44a is not at ground level.

If the corresponding terminals of the docking port 20a and the docking connector 20b are connected correctly to each other, the connection detection terminal 44b of the EC/KBC 40b of the keyboard dock 12 is grounded in the keyboard dock 12 via the circuit constituted by the connection line 31b, the first relay terminals 28b and 28b, the connection line 31a and the second relay terminals 30a and 30b. If the corresponding terminals of the docking port 20a and the docking connector 20b are not connected to each other, the above circuit is not formed and the connection detection terminal 44b of the EC/KBC 40b of the keyboard dock 12 is pulled up to the power supply vice via the resistor 48b. Therefore, the connection detection terminal 44b is not at ground level.

As described above, since the connection detection terminal 44a is connected to a predetermined level (ground level in FIG. 2) in the other apparatus via the circuit constituted by the connection line 31b connecting two terminals of the docking connector 20b and/or the connection line 31a connecting two terminals of the docking port 20a, whether the tablet 10 (the docking port 20a thereof) and the keyboard dock 12 (the docking connector 20b thereof) are connected correctly to each other can be correctly detected.

The connection can be correctly detected regardless of whether the other apparatus is turned on or off, or being switched between on and off.

Since the level of the connection detection terminal 44a or 44b is instantly varied according to whether the corresponding terminals of the docking port 20a and the docking connector 20b are connected to each other or not, variation of the connection state can be instantly detected. Therefore, operations conditional on the connection detection can be immediately started and processing such as power supply and communication can be facilitated. In addition, since the tablet 10 and the keyboard dock 12 can determine the connection detection at the same time, the apparatuses can be easily synchronized with each other.

Since the connection detection terminals 44a and 44b are connected to the detection terminals 26a and 26b via the reverse-current prevention diodes 46a and 46b, respectively, a high voltage or a large current is not imposed on the EC/KBC 40a and the EC/KBC 40b and the EC/KBC 40a and the EC/KBC 40b are not damaged even it an apparatus other than the valid apparatus is connected.

The tablet 10 is on the left and the keyboard dock 12 is on the right in FIG. 2; but, vice versa, the keyboard dock 12 may be on the left and the tablet 10 may be on the right.

Both the tablet 10 and the keyboard dock 12 are configured to detect the connection in FIG. 2. However, one of them, for example, the keyboard dock 12 alone may be configured to detect the connection and the tablet 10 does not need to be configured to detect the connection.

FIG. 3 shows a circuit configuration in a case where the keyboard dock 12 alone detects the connection in FIG. 2. The configuration of the keyboard dock 12 is the same as the configuration shown in FIG. 2 except that the ground terminal 24b and the detection terminal 26b of the docking connector 20b and the reverse-current prevention diode 46b are omitted. The tablet 10 includes the first relay terminal 28a, the second relay terminal 30a and the connection line 31a connecting these terminals to each other, and the other components are omitted.

In this configuration, too, when the tablet 10 end the keyboard dock 12 are connected correctly to each other, the connection detection terminal 44b of the EC/KBC 40b of the keyboard dock 12 to grounded in the keyboard dock 12 via the first relay terminals 28b and 28a, the connection line 31a and the second relay terminals 30a and 30b. If the normal connection between the tablet 10 and the keyboard dock 12 is cut off, the connection detection terminal 44b of the EC/KBC 40b of the keyboard dock 12 is pulled up to the power supply Vcc via the resistor 48b. Therefore, the connection detection terminal 44b is not at ground level.

If the tablet 10 alone is configured to detect the connection and the keyboard dock 12 is not configured to detect the connection, the tablet 10 may be on the right and the keyboard dock 12 may be on the left in FIG. 3.

If one of the tablet 10 and the keyboard dock 12 alone detects the connection, the configuration on the right in FIG. 2 is implemented as an apparatus to detect the connection in FIG. 3, but the configuration on the left in FIG. 2 may be implemented as an apparatus to detect the connection.

Figure 4:
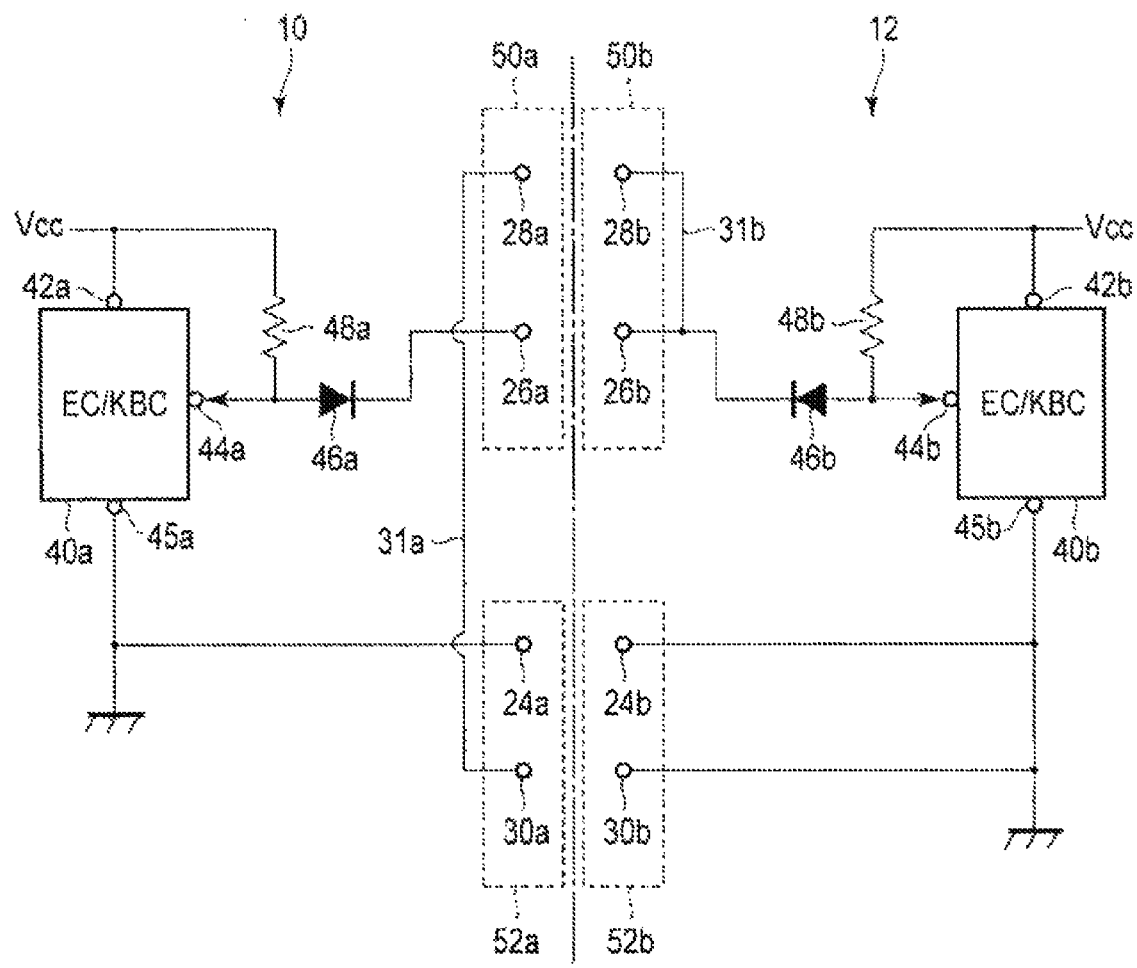
FIG. 4 is a circuit diagram showing another modified embodiment of the connection detection circuit of the embodiment.

All the terminals are accommodated in a docking port and a docking connector in FIGS. 2 and 3, but the terminals may be accommodated by being divided into a plurality of docking ports and docking connectors, for example, two docking ports 50a and 52b and two docking connectors 50b and 52b as shown in FIG. 4. The two docking ports 50a and 52b may be provided at the right and left ends of the under surface of the tablet 10. As in the case of FIG. 2, the second relay terminal 30b can be connected to a known level, a signal source, etc., for connection detection, and is grounded in FIG. 4. In the case of FIG. 4, too, if the first relay terminal 28a and the second relay terminal 30a are arranged in the different docking ports 50a and 52a, respectively, with intervals, and the first relay terminal 28b and the second relay terminal 30b are arranged in the different docking connectors 50b and 52b, respectively, with intervals, the corresponding terminals are not connected to each other and false detection can be prevented when the tablet 10 is obliquely attached to the support 14 of the keyboard dock 12.

The tablet 10 is on the left and the keyboard dock 12 is on the right in FIG. 4; but, vice versa, the keyboard dock 10 may be on the left and the tablet 10 may be on the right.

Both the tablet 10 and the keyboard dock 12 are configured to detect the connection in FIG. 4. However, one of them, for example, the keyboard dock 12 alone may be configured to detect the connection and the tablet 10 does not need to be configured to detect the connection.

Figure 5:
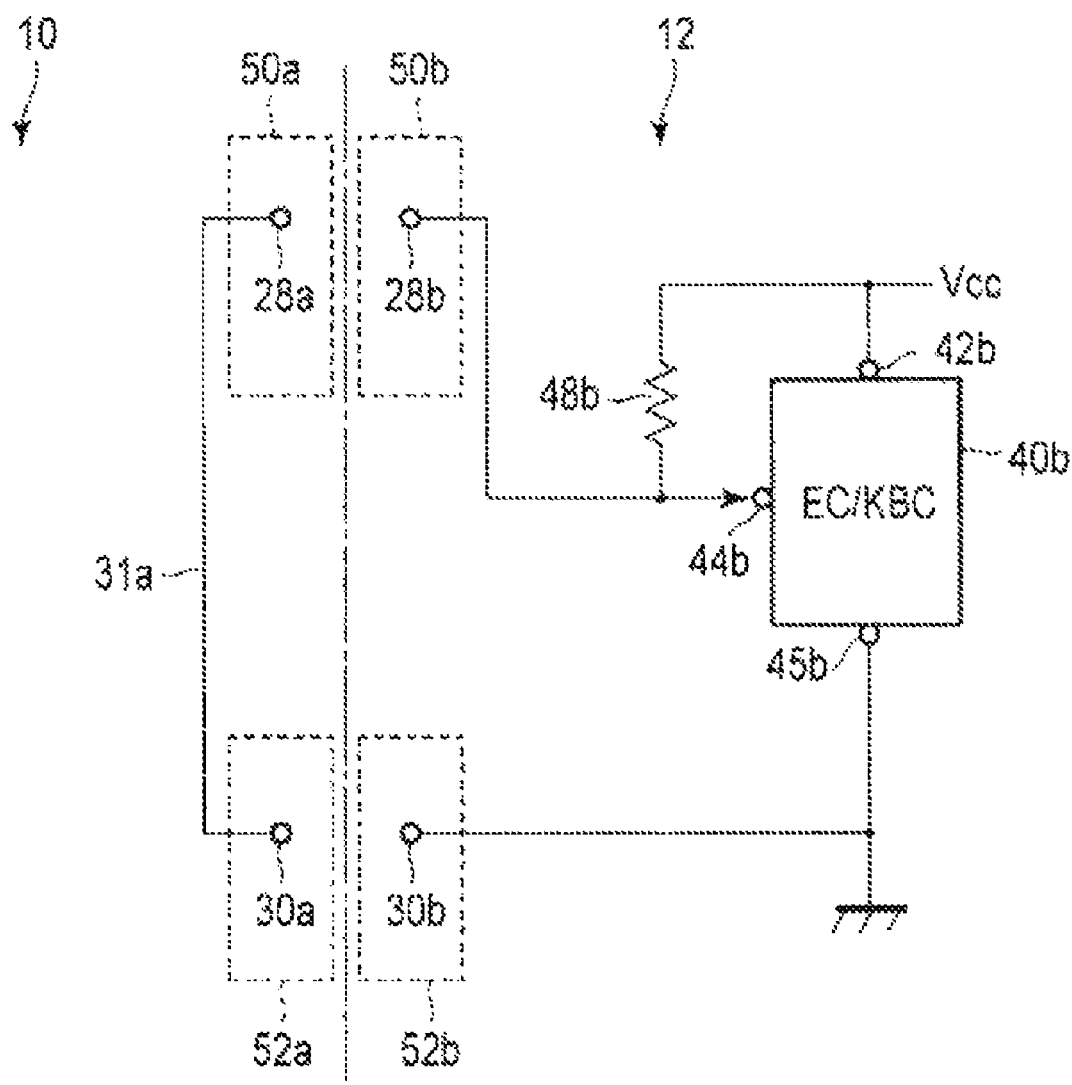
FIG. 5 is a circuit diagram showing yet another modified embodiment of the connection detection circuit of the embodiment.

FIG. 5 shows a circuit configuration in a case where the keyboard dock 12 alone detects the connection in FIG. 4. The configuration of the keyboard dock 12 is the same as the configuration shown in FIG. 4 except that the ground terminal 24b and the detection terminal 26b of the docking connector 20b and the reverse-current prevention diode 46b are omitted. The tablet 10 includes the first relay terminal 28a, the second relay terminal 30a and the connection line 31a connecting these terminals to each other, and the other components are omitted.

If the tablet 10 alone is configured to detect the connection and the keyboard dock 12 is not configured to detect the connection, the tablet 10 may be on the right and the keyboard dock 12 may be on the left in FIG. 5.

If one of the tablet 10 and the keyboard dock 12 alone detects the connection, the configuration on the right in FIG. 1 is implemented as an apparatus to detect the connection in FIG. 5, but the configuration on the left in FIG. 4 may be implemented as an apparatus to detect the connection.

Figure 6:
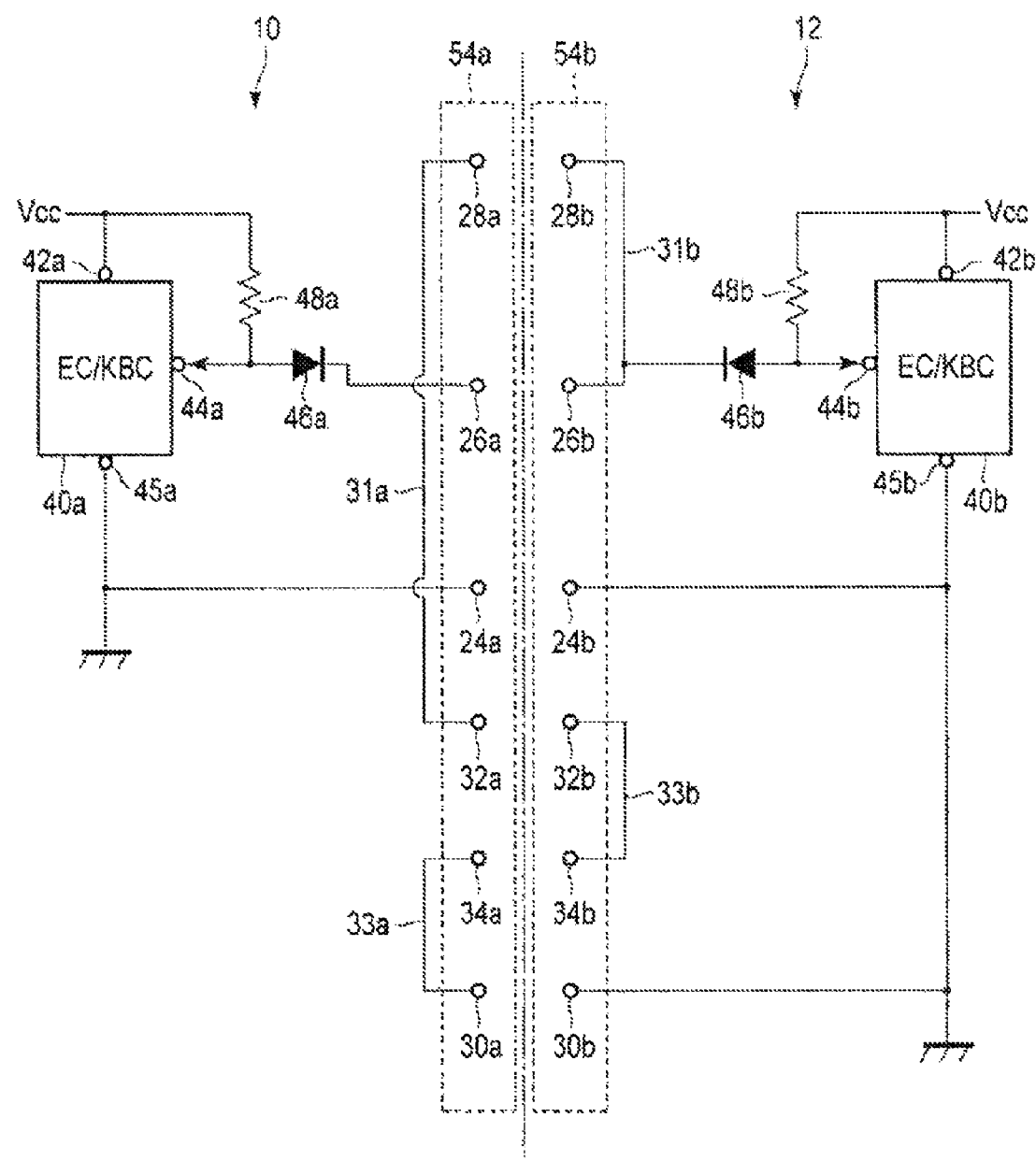
FIG. 6 is a circuit diagram showing yet another modified embodiment of the connection detection circuit of the embodiment.

A connection line makes the connection between the terminals of the docking connector 20b or the docking port 20a, but a plurality of connection lines and terminals may be provided. FIG. 6 shows an example of providing two connection lines.

The docking port 54a includes third and fourth relay terminals 32a and 34a in addition to the ground terminal 24a, the detection terminal 26a and the first and second relay terminals 28a and 30a. The first and third relay terminals 28a and 32a are connected to each other via the connection line 31a and the fourth and second relay terminals 34a and 30a are connected to each other via a connection line 33a.

The docking port connector 54b includes third and fourth relay terminals 32b and 34b in addition to the ground terminal 24b, the detection terminal 26b and the first and second relay terminals 28b and 30b. The first relay terminal 28b and the connection detection terminal 26b are connected to each other via the connection line 31b, and the third and fourth relay terminals 32b and 34b are connected to each other via a connection line 33b.

According to such a configuration, if the corresponding terminals of the docking port 54*a* and the docking connector 54*b* are connected correctly to each other, the connection detection terminal 44*a* of the EC/KBC 40*a* of the tablet 10 is grounded in the keyboard deck 12 via the connection detection terminals 26*a* and 26*b*, the connection line 31*b*, the first relay terminals 28*b* and 28*a*, the connection line 31*a*, the third relay terminals 32*a* and 32*b*, the connection line 33*b*, the fourth relay terminals 34*b* and 34*a*, the connection line 33*a* and the second relay terminals 30*a* and 30*b*. As in the case of FIG. 2, the second relay terminal 30*b* can be connected to net only the ground, but also a known level, a signal source, etc., for connection detection. If the corresponding terminals of the docking port 54*a* and the docking connector 54*b* are not connected to each other, the connection detection terminal 44*a* of the EC/KBC 40*a* of the tablet 10 is pulled up to the power supply Vcc via the resistor 48*a*. Therefore, the connection detection terminal 44*a* is not at ground level.

If the corresponding terminals of the docking port 54*a* and the docking connecter 54*b* are connected correctly to each other, the connection detection terminal 44*b* of the EC/KBC 40*b* of the keyboard dock 12 is grounded, in the keyboard dock 12 via the connection line 31*b*, the first relay terminals 28*b* and 28*a*, the connection line 31*a*, the third relay terminals 32*a* and 32*b*, the connection line 33*b*, the fourth relay terminals 34*b* and 34*a*, the connection line 33*a* and the second relay terminals 30*a* and 30*b*. If the corresponding terminals of the docking port 54*a* and the docking connector 54*b* are not connected to each other, the connection detection terminal 44*b* of the EC/KBC 40*b* of the keyboard dock 12 is pulled up to the power supply Vcc via the resistor 48*b*. Therefore, the connection detection terminal 44*b* is not at ground level.

The number of relay terminals and the number of connection lines making the connection between two relay terminals stay be further increased.

The tablet 10 is on the left and the keyboard dock 12 is on the right in FIG. 6; but, vice versa, the keyboard dock 12 may be on the left and the tablet 10 may be on the right.

Both the tablet 10 and the keyboard dock 12 are configured to detect the connection in FIG. 6. However, one of them, for example, the keyboard dock 12 alone may be configured to detect the connection and the tablet 10 does not need to be configured to detect the connection.

Figure 7:
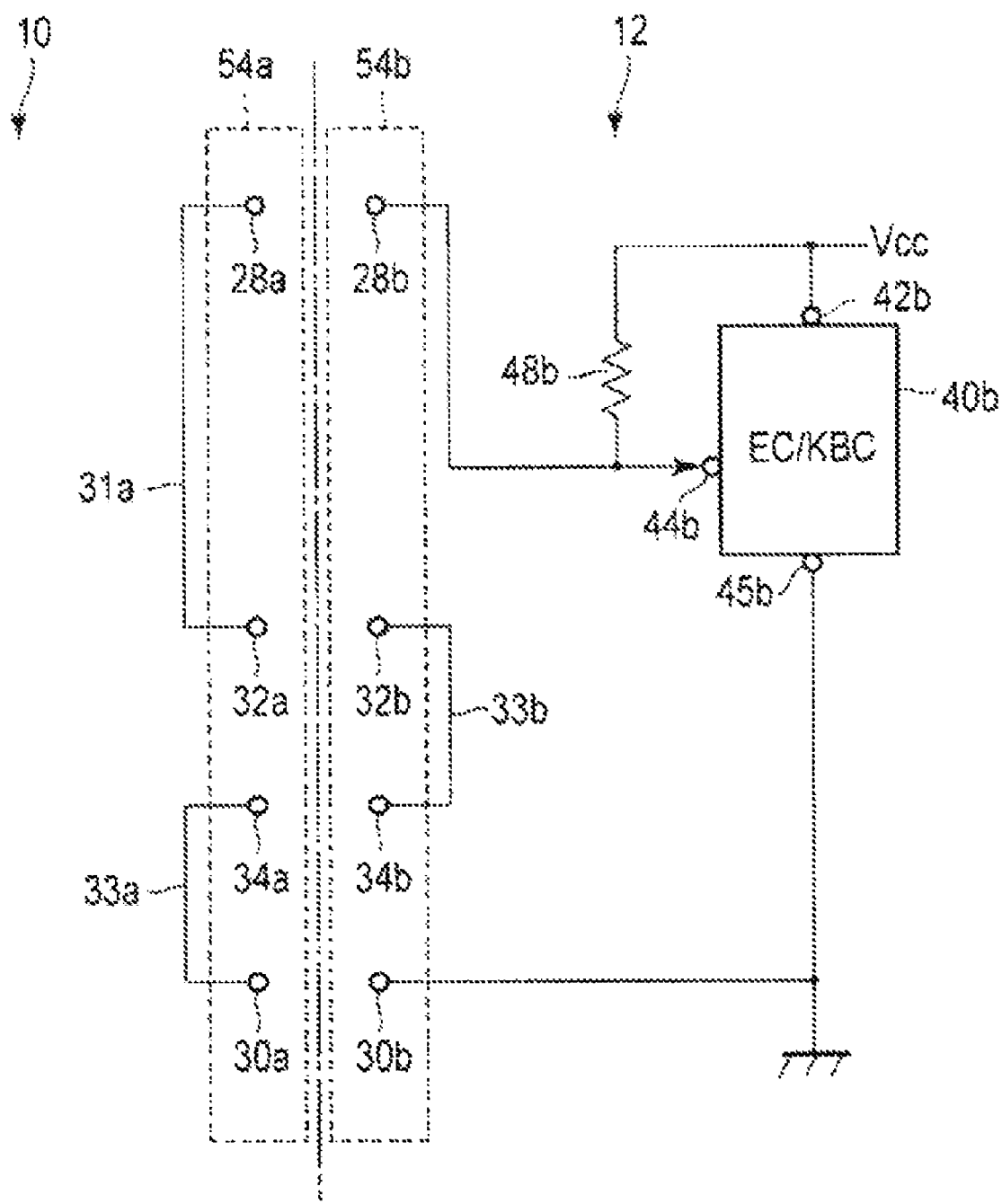
FIG. 7 is a circuit diagram showing yet another modified embodiment of the connection detection circuit of the embodiment.

FIG. 7 show a circuit configuration in a case where the keyboard dock 12 alone detects the connection in FIG. 6. The configuration of the keyboard dock 12 is the same as the configuration shown in FIG. 6 except that the ground terminal 24*b* and the detection terminal 26*b* of the docking connector 54*b* and the reverse-current prevention diode 46*b* are omitted. The tablet 10 include a the first, second, third and fourth relay terminals 28*a*, 30*a*, 32*a* and 34*a* and the connection lines 31*a* and 33*a*, and the other components are omitted.

In this configuration, too, when the tablet 10 and the keyboard dock 12 are connected correctly to each other, the connection detection terminal 44*b* of the EC/KBC 40*b* of the keyboard, dock 12 is grounded in the keyboard dock 12 via the first relay terminals 28*b* and 28*a*, the connection line 31*a*, the third relay terminal 32*a* and 32*b*, the connection line 33*b*, the fourth relay terminals 31*b* and 34*a*, the connection line 33*a* and the second relay terminals 30*a* and 30*b*. If the normal connection between the tablet 10 and the keyboard dock 12 is cut off, the connection detection terminal 44*b* of the EC/KBC 40*b* of the keyboard dock 12 is pulled up to the power supply Vcc via the resistor 48*b*. Therefore, the connection detection terminal 44*b* is not at ground level.

If the tablet 10 alone is configured to detect the connection and the keyboard dock 12 is not configured to detect the connection, the tablet 10 may be on the right and the keyboard dock 12 may be on the left in FIG. 7.

If one of the tablet 10 and the keyboard dock 12 alone detects the connection, the configuration on the right in FIG. 6 is implemented as an apparatus to detect the connection in FIG. 7, but the configuration on the left to FIG. 6 may be implemented as an apparatus to detect the connection.

The connection detection terminal 44*a* or 44*b* is connected to ground level via the circuit including the connection line 31*b* or 31*a* of the other apparatus in FIG. 2, but this is not limited to ground level, but may be a predetermined level as shown in FIG. 8.

In an example shown in FIG. 6, the second relay terminal 30*b* of the docking connector 20*b* of the keyboard dock 12 is pulled up to the power supply Vcc via a resistor 60*b*. The connection detection terminal 44*a* of the EC/KBC 40*a* of the tablet 10 is not pulled up, but is pulled down to ground via a resistor 58*a*. The connection detection terminal 44*b* of the EC/KBC 40*b* of the keyboard dock 12 is not pulled up, but is pulled down to ground via a resistor 58*b*.

If the corresponding terminals or the docking port 20*a* and the docking connector 20*b* are connected correctly to each other, the connection detection terminal 44*a* of the EC/KBC 40*a* of the tablet 10 is connected to the power supply Vcc via the circuit constituted by the connection detection terminals 26*a* and 26*b*, the connection line 31*b*, the first relay terminals 28*b* and 28*a*, the connection line 31*a*, the second relay terminals 30*a* and 30*b* and the resistor 60*b*. Therefore, the potential of the connection defection terminal 44*a* is Vcc× (resistance value of the resistor 58*b*)/(resistance value of the resistor 60*b*+resistance value of the resistor 58*b*). If the corresponding terminals of the docking port 20*a* and the docking connector 20*b* are not connected to each other, the above circuit is not formed and the connection detection terminal 44*a* of the EC/KBC 40*a* of the tablet 10 is pulled down to ground via the resistor 58*a*.

Similarly, if the corresponding terminals of the docking port 20*a* and the docking connector 20*b* are connected correctly to each other, the connection detection terminal 44*b* of the EC/KBC 40*b* of the keyboard dock 12 is connected to the power supply Vcc via the circuit constituted by the connection line 31*b*, the first relay terminals 28*b* and 28*a*, the connection line 31*a*, the second relay terminals 30*a* and 30*b* and the resistor 60*b*. Therefore, the potential of the connection detection terminal 44*b* is Vcc×(resistance value of the resistor 58*b*)/(resistance value of the resistor 60*b*+a resistance value of the resistor 58*b*). If the corresponding terminal of the docking port 20*a* and the docking connector 20*b* are not connected to each other, the above circuit is not formed and the connection detection terminal 44*b* of the EC/KBC 40*b* of the keyboard dock 12 is pulled down to ground via the resistor 58*b*.

Therefore, the EC/KBC 40*a* and the EC/KBC 40*b* determine that the tablet 10 and the keyboard dock 12 are connected to each other when the connection detection terminals 44*a* and 44*b* are at the level Vcc×(resistance value of the resistor 58*b*)/(resistance value of the resistor 60*b*+ resistance value of the resistor 58*b*), and determine that the tablet 10 and the keyboard dock 12 are not connected to each other when the connection detection terminals 44*a* and 44*b* are at other levels.

The tablet 10 is on the left and the keyboard dock 12 is on the right in FIG. 8; but, vice versa, the keyboard dock 12 may be on the left and the tablet 10 may be on the right.

Both the tablet 10 and the keyboard dock 12 are configured to detect the connection in FIG. 8. However, one of them, for example, the keyboard dock 12 alone may be configured to detect the connection and the tablet 10 does not need to be configured to detect the connection.

Figure 9:
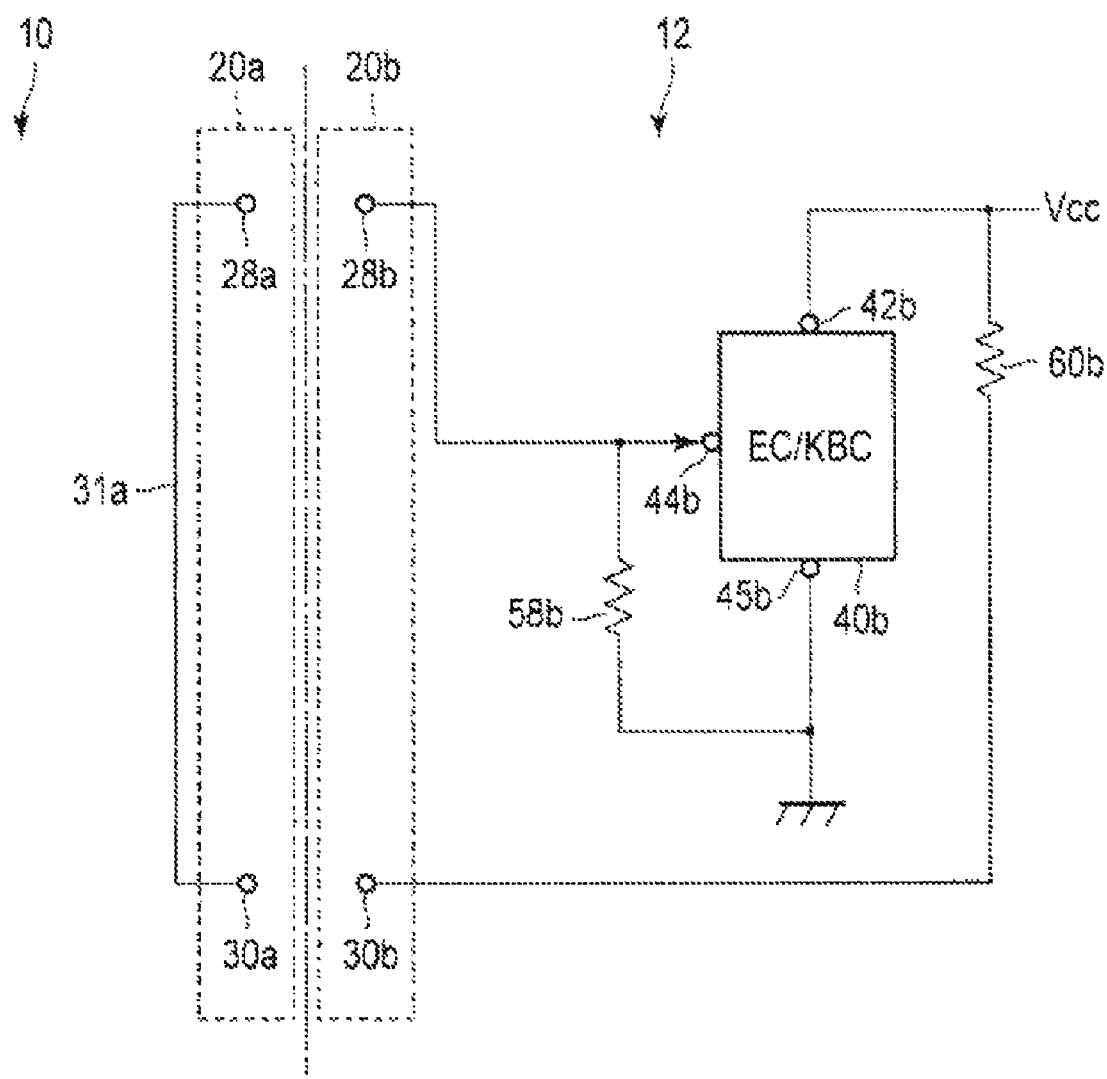
FIG. 9 is a circuit diagram showing yet another modified embodiment of the connection detection circuit of the embodiment.

FIG. 9 shows a circuit configuration in a case where the keyboard dock 12 alone detects the connection in FIG. 8. The configuration of the keyboard dock 12 is the same as the configuration shown in FIG. 8 except that the ground terminal 24b and the detection terminal 26b of the docking connector 20b and the reverse-current prevention diode 46b are omitted. The tablet 10 includes the first relay terminal 28a, the second relay terminal 30a and the connection line 31a connecting these terminals to each other, and the other components are omitted.

In this configuration, too, when the tablet 10 and the keyboard dock 12 are connected correctly to each other, the connection detection terminal 44b of the EC/KBC 40b of the keyboard dock 12 is connected to the power supply Vcc via the first relay terminals 28b and 28a, the connection line 31a, the second relay terminals 30a and 30b and the resistor 60b. It the normal connection between the tablet 10 and the keyboard dock 12 is cut off, the connection detection terminal 44b of the EC/KBC 40b of the keyboard dock 12 is pulled down to ground via the resistor 58b.

If the tablet 10 alone is configured to detect the connection and the keyboard dock 12 is not configured to detect the connection, the tablet 10 may be on the right and the keyboard dock 12 may be on the left in FIG. 9.

If one of the tablet 10 and the keyboard dock 12 alone detects the connection, the configuration on the right in FIG. 8 is implemented as an apparatus to detect the connection in FIG. 3, but the configuration on the left in FIG. 3 may be implemented as an apparatus to detect the connection.

Figure 10:
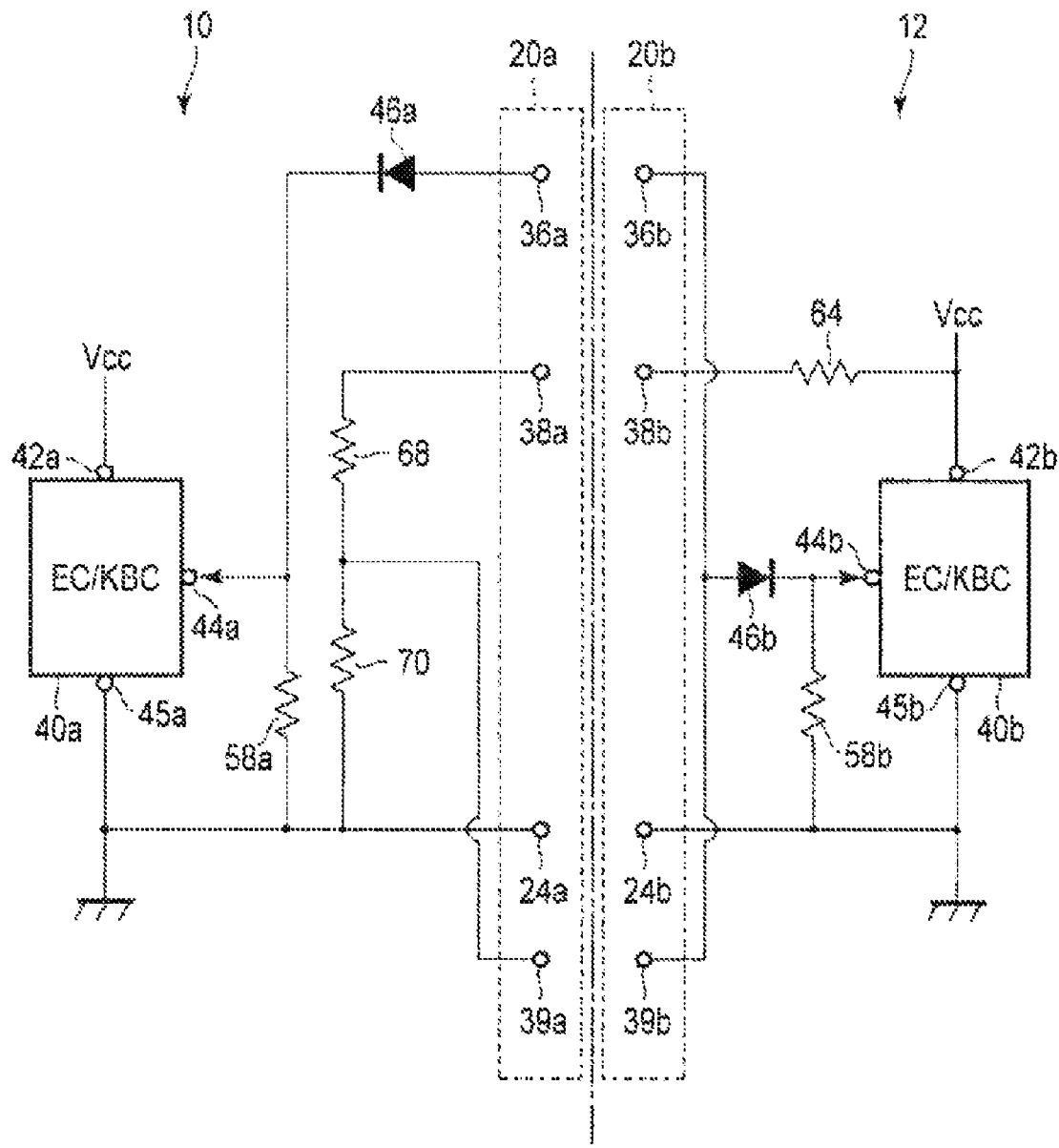
FIG. 10 is a circuit diagram showing yet another modified embodiment of the connection detection circuit of the embodiment.

In the example of FIG. 8, all of the resistors 58b and 60b producing a voltage level for connection detection from the power supply Vcc are provided in one of the apparatuses, for example, the keyboard dock 12. However, some of the resistors may be provided in the other apparatus as shown in FIG. 10. According to this configuration, if a resistance value is predetermined according to the typo of the other apparatus, the type, etc., of the other apparatus can be identified based on the level of the connection detection terminal when the apparatuses are connected to each other.

In FIG. 10, the connection detection terminal 44a of the EC/KBC 40a of the tablet 10 is connected to the connection terminal 36a via the reverse-current prevention diode 46a. The relay terminal 38a is grounded via resistors 68 and 70. A connection point of the resistors 68 and 70 is connected to the relay terminal 39a. The connection detection terminal 44a is pulled down to ground via the resistor 58a. The resistor 58a is provided to prevent the connection detection terminal 44a from being at an indefinite level when the apparatuses are root connected to each other, and has a sizable resistance value. The connection detection terminal 44b of the EC/KBC 40b of the keyboard dock 12 is connected to the detection terminal 36b and the relay terminal 39b via the reverse-current prevention diode 46b. The relay terminal 38b is pulled up to the power supply Vcc via a resistor 64. The connection detection terminal 44b is pulled down to ground via the resistor 58b.

If the corresponding terminals of the docking port 20a and the docking connector 20b are connected correctly to each other, the connection detection terminal 44a of the EC/KBC 40a of the tablet 10 is pulled up to the power supply Vcc of the keyboard dock 12 via the detection terminals 36a and 30b, the relay terminals 39b and 39a, the resistor 68, the relay terminals 38a and 38b and the resistor 64. Therefore, the potential of the connection detection terminal 44a is Vcc×(resistance value of the resistor 70)/(resistance value of the resistor 70+resistance value of the resistor 68+resistance value of the resistor 64). If the corresponding terminals of the docking port 20a and the docking connector 20b are not connected to each other, the connection detection terminal 44a of the EC/KBC 40a of the tablet 10 is pulled down to ground via the resistor 58a. Therefore, the connection detection terminal 44a is not at the level Vcc×(resistance value of the resistor 70)/(resistance value of the resistor 70+resistance value of the resistor 68+resistance value of the resistor 64).

If the corresponding terminals of the docking port 20a and the docking connector 20b are connected correctly to each other, the connection detection terminal 44b of the EC/KBC 40b of the keyboard dock 12 is pulled up to the power supply Vcc via the relay terminals 39b and 39a, the resistor 68, the relay terminals 38a and 38b, and the resistor 64. Therefore, a potential of the connection detection terminal 44b is Vcc×(resistance value of the resistor 70)/(resistance value of the resistor 70+resistance value of the resistor 68+resistance value of the resistor 64). If the corresponding terminals of the docking port 20a and the docking connector 20b are not connected to each other, the connection defection terminal 44b of the EC/KBC 40b of one keyboard dock 12 is pulled down to ground via the resistor 58b. Therefore, the connection detection terminal 44b is not at the level Vcc×(resistance value of the resistor 70)/(resistance value of the resistor 70+resistance value of the resistor 68+resistance value of the resistor 64).

By setting the values of the resistors 68 and 70 according to the type, format, version, etc., of the tablet 10, the type, format, version, etc., of the tablet 10 can be identified in accordance with the level of the connection detection terminal 44b of the EC/KBC 40b of the keyboard dock 12 detecting the connection. By setting the value of the resistor 64 according to the type, format, version, etc., of the keyboard dock 12, the type, format, version, etc., of the keyboard dock 12 can also be identified in accordance with the level of the connection detection terminal 44a of the EC/KBC 40a of the tablet 10 detecting the connection. The resistor 64 may be omitted and the relay terminal 38b may be short-circuited to the power supply Vcc. The relay terminal 38a does not need to be grounded via the resistors 68 and 70, but may be just connected to the relay terminal 39a via the resistor 68. That is, the connection line which includes the resistor 70 connecting one end of the resistor 68 to the ground terminal can be omitted.

Both the tablet 10 and the keyboard dock 12 are configured to detect the connection in FIG. 10. However, one of them, for example, the keyboard dock 12 alone may be configured to detect the connection and the tablet 10 does not need to be configured to detect the connection.

Figure 11:
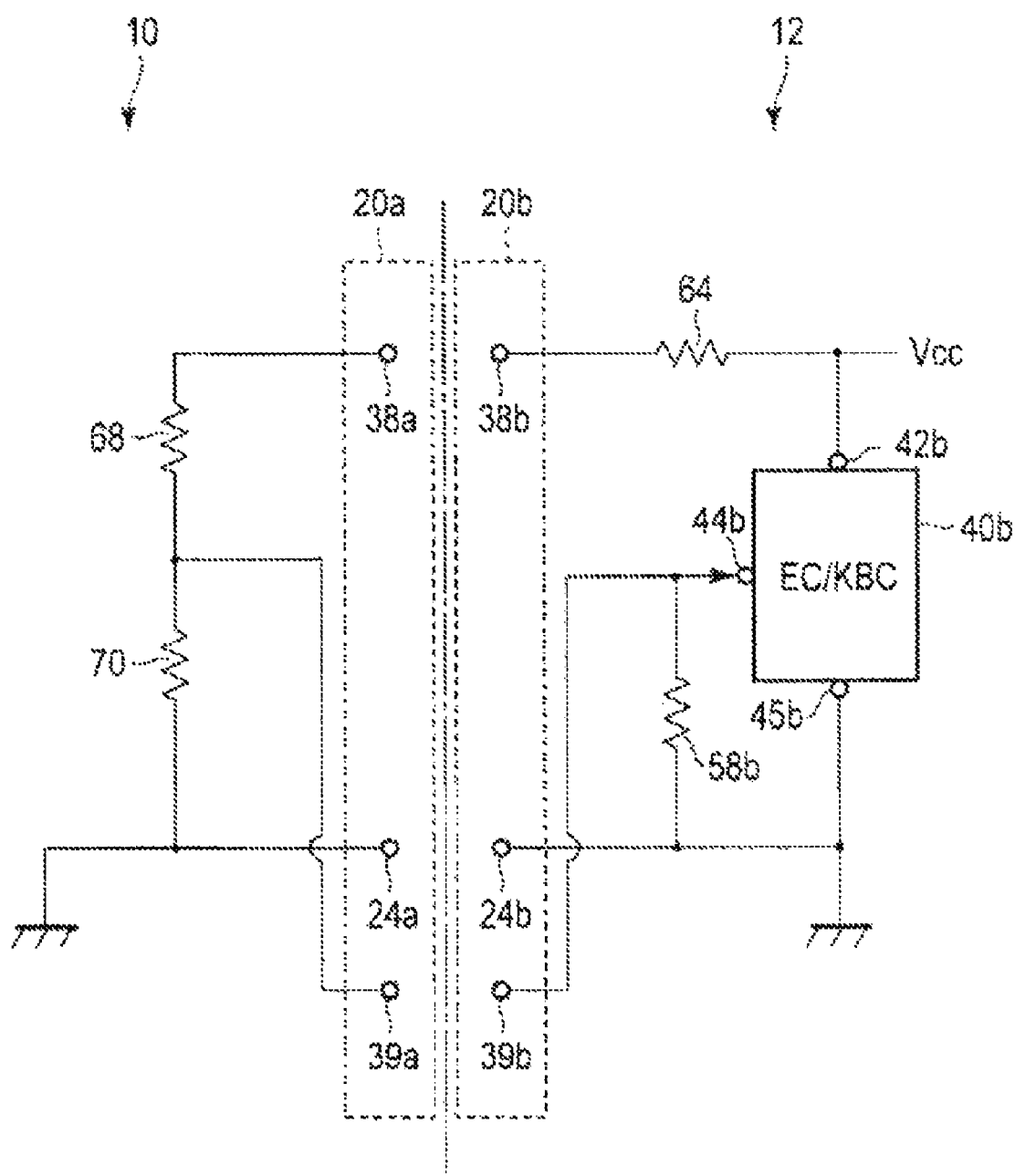
FIG. 11 is a circuit diagram showing yet another modified embodiment of the connection detection circuit of the embodiment.

FIG. 11 shows a circuit configuration in a case where the keyboard dock 12 alone detects the connection in FIG. 10.

In this configuration, too, when the tablet 10 and the keyboard dock 12 are connected correctly to each other, the connection detection terminal 44b of the EC/KBC 40b of the keyboard dock 12 is connected to the power supply Vcc via the relay terminals 39b and 39a, the resistor 68, the relay terminals 38a and 38b and the resistor 64. If the normal connection between the tablet 10 and the keyboard dock 12 is cut off, the connection detection terminal 44b of the EC/KBC 40*b* of the keyboard dock 12 is pollen down to ground via the resistor 58*b*. In FIG. 11, too, the resistor 64 may be omitted and the relay terminal 38*b* may be short-circuited to the power supply Vcc. The relay terminal 38*a* does not need to be grounded via the resistors 68 and 70, but may be just connected to the relay terminal 39*a* via the resistor 68. That is, the connection line which includes the resistor 70 connecting one end of the resistor 68 to the ground terminal can be remitted.

If the tablet 10 alone is configured to detect the connection and the keyboard dock 12 is not configured to detect the connection, the tablet 10 may be on the right and the keyboard dock 12 may be on the left in FIG. 11.

If one of the tablet 10 and the keyboard dock 12 detects the connection, the configuration on the right in FIG. 10 is implemented as an apparatus to detect the connection in FIG. 11, but the configuration on the left in FIG. 10 may be implemented as an apparatus to detect the connection.

Figure 12:
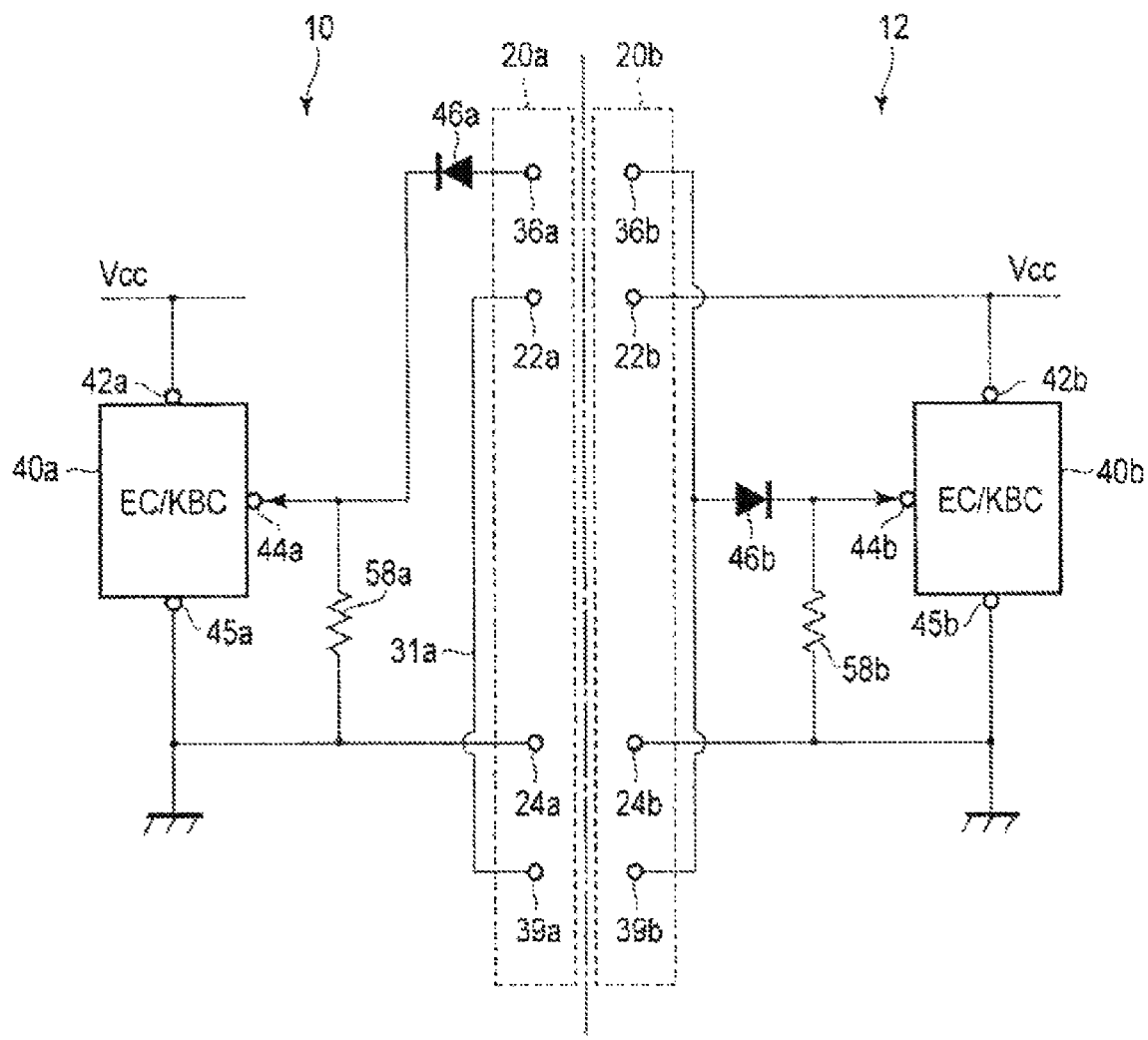
FIG. 12 is a circuit diagram showing yet another modified embodiment of the connection detection circuit of the embodiment.

The connection detection terminal 44*a* or 44*b* is connected to ground level via the circuit including the connection line 31*b* or 31*a* of the other apparatus in FIG. 2, but this is not limited to ground level, but may be the power supply Vcc as shown in FIG. 12.

In an example shown in FIG. 12, the connection detection terminal 44*a* of the EC/KBC 40*a* of the tablet 10 is connected to the relay terminal 36*a* via the reverse-current prevention diode 46*a*, and is pulled down to ground via the resistor 58*a*. The relay terminals 22*a* and 39*a* are connected to each other via the connection line 31*a*. The connection detection terminal 44*b* of the EC/KBC 40*b* of the keyboard dock 12 is connected to the relay terminals 36*b* and 39*b* era the reverse-current prevention diode 46*b*, and is pulled down to ground via the resistor 58*b*.

If the corresponding terminals of the docking port 20*a* and the docking connector 20*b* are connected correctly to each other, the connection detection terminal 44*a* of the EC/KBC 40*a* of the tablet 10 is connected to the power supply Vcc via the circuit constituted by the relay terminals 36*a*, 36*b*, 39*b* and 39*a*, the connection line 31*a* and the relay terminals 22*a* and 22*b*. If the corresponding terminals of the docking port 20*a* and the docking connector 20*b* are not connected to each other, the above circuit is not formed and the connection detection terminal 44*a* of the EC/KBC 40*a* of the tablet 10 is at a level according to the resistance value of the resistor 58*a*.

Similarly, if the corresponding terminals of the docking port 20*a* and the docking connector 20*b* are connected correctly to each other, the connection detection terminal 44*b* of the EC/KBC 40*b* of the keyboard dock 12 is connected to the power supply Vcc via the circuit constituted by the relay terminals 39*b* and 39*a*, the connection line 31*a* and the relay terminals 22*a* and 22*b*. If the corresponding terminals of the docking port 20*a* and the docking connector 20*b* are not connected to each other, the above circuit is not formed and the connection detection terminal 44*a* of the EC/KBC 40*a* of the tablet 10 is at a level according to the resistance value of the resistor 58*b*.

The tablet 10 is on the left and the keyboard dock 12 is on the right in FIG. 12; but, vice versa, the keyboard dock 12 may be on the left and the tablet 10 may be on the right.

Both the tablet 10 and the keyboard dock 12 are configured to detect the connection in FIG. 12. However, one of them, for example, the keyboard dock 12 alone may be configured to detect the connection and toe tablet 10 does not need to be configured to detect the connection.

FIG. 12 shows a circuit configuration in a case where the keyboard dock 12 alone detects the connection in FIG. 12.

The configuration of the keyboard dock 12 is the same as the configuration shown in FIG. 12 except that the earth/relay terminal 24*b* of the docking connector 20*b* and the reverse-current prevention diode 46*b* are omitted.

In this configuration, too, when the tablet 10 and the keyboard dock 12 are connected correctly to each other, the connection detection terminal 44*b* of the EC/KBC 40*b* of the keyboard dock 12 is connected to the power supply Vcc via the relay terminals 39*b* and 39*a*, the connection line 31*a* and the relay terminals 22*a* and 22*b*. If the normal connection between the tablet 10 and the keyboard dock 12 is cut off, the connection detection terminal 44*b* of the EC/KBC 40*b* of the keyboard dock 12 is at a level according to the resistance value of the resistor 58.

Figure 13:
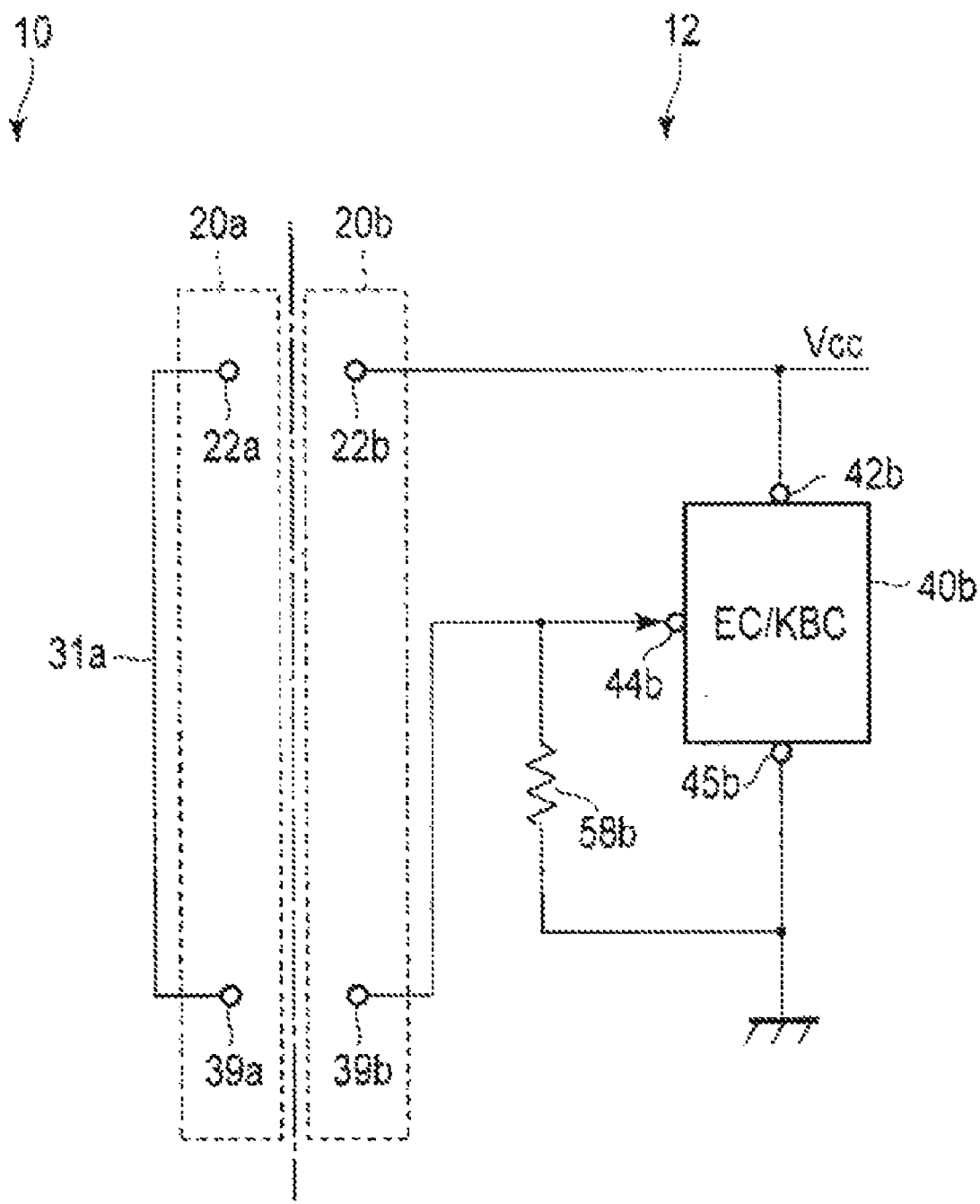
FIG. 13 is a circuit diagram showing yet another modified embodiment of the connection detection circuit of the embodiment.

If the tablet 10 alone is configured to detect the connection and the keyboard dock 12 is not configured to detect the connection, the tablet 10 may be on the right and the keyboard dock 12 may be on the left in FIG. 13.

If one of the tablet 10 and the keyboard dock 12 detects the connection, the configuration on the right in FIG. 12 is implemented as an apparatus to detect the connection in FIG. 13, but the configuration on the left in FIG. 12 may be implemented as an apparatus to detect the connection.

In the above embodiments, the EC/KBC 40*a* and 40*b* detect, the connection between the tablet 10 and the keyboard dock 12 based on whether the cross-section detection terminal is at a predetermined voltage or not. FIG. 14 shows an example of a circuit which detects the connection based on not a voltage, but presence or absence of a specific signal.

FIG. 14 is the same as FIG. 2 expect that the second relay terminal 30*b* is not grounded but connected to a pulse generator 14 provided in the keyboard dock 12. The pulse generator 14 generates a pulse having parameters according to the type, format, version, etc., of the keyboard dock 12 such as a pulse of a predetermined frequency and a certain level, a pulse of a certain frequency and a predetermined level, etc.

If the corresponding terminals of the docking port 20*a* and the docking connector 20*b* are connected correctly to each other, the connection detection terminal 44*a* or the EC/KBC 40*a* of the tablet 10 is supplied with an output pulse of the poise generator 14 of the keyboard dock 12 via a circuit constituted by the second relay terminals 30*b* and 30*a*, the connection line 31*a*, the first relay terminals 28*a* and 28*b*, the connection line 31*b* and the connection detection terminals 26*b* and 26*b*. If the corresponding terminals of the docking port 20*a* and the docking connector 20*b* are not connected to each other, the above circuit is not formed and the connection detection terminal 44*a* of the EC/KBC 40*a* of the tablet 10 is pulled up to the power supply Vcc via the resistor 48*a*. Therefore, the connection detection terminal 44*a* is not supplied with the noise.

If the corresponding terminals of the docking port 20*a* and the docking connector 20*b* are connected correctly to each other, the connection detection terminal 44*b* of the EC/KBC 40*b* of the keyboard dock 12 is supplied with the output pulse of the pulse generator 14 of the keyboard dock 12 via a circuit constituted by the relay terminals 30*b* and 30*a*, the connection line 31*a*, the first relay terminals 28*a* and 28*b* and the connection line 31*b*. If the corresponding terminals of the docking port 20*a* and the docking connector 20*b* are not connected to each other, the above circuit is not formed and the connection detection terminal 44*b* of the EC/KBC 40*b* of the keyboard dock 12 is pulled up to the power supply Vcc via the resistor 48*b*. Therefore, the connection detection terminal 44*b* is not supplied with the pulse.

Figure 15:
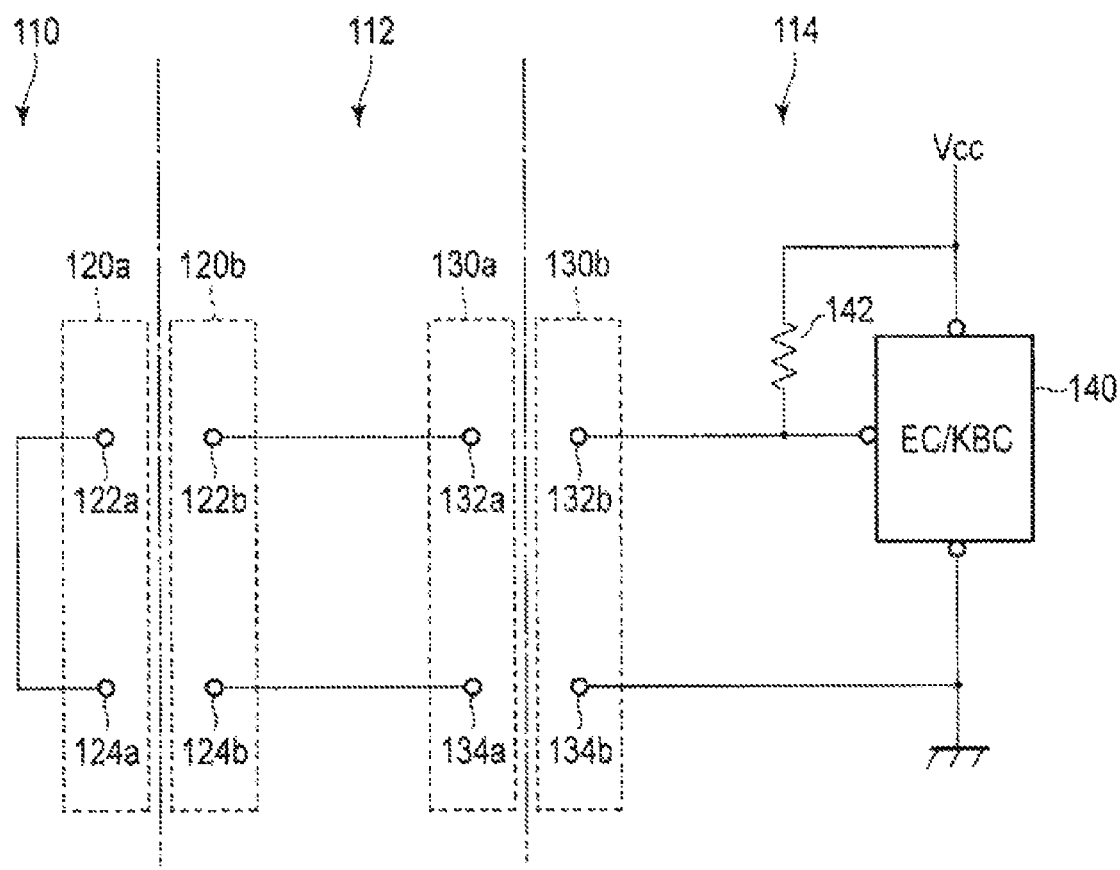
FIG. 15 is a circuit diagram showing yet another modified embodiment of the connection detection circuit of the embodiment.

The above description is related to a case where the connection between two electronic apparatuses is detected. A modified embodiment where three or more electronic apparatuses are connected in series is hereinafter described. FIG. 15 is an example of a circuit configuration in a case where a keyboard dock 114 is connected to a tablet 112, and a smart phone 111 is further put on (connected to) the tablet 112. The connection detection of two electronic apparatuses is executed by generating a signal of a predetermined level or a predetermined state in an apparatus having a detection circuit (for example, an EC/KBC), and constituting a circuit which allows the signal to be returned to the original apparatus via the other apparatus. The connection detection of three or more electronic apparatuses is executed by including terminals and signal lines of three electronic apparatuses in the above circuit.

For convenience of description, an EC/KBC 140 which is an example of a detection circuit is assumed to be included in the keyboard dock 114. The connection detection terminal of the EC/KBC 140 is connected to the power supply Vcc via a pull-up resistor 142. A docking connector 130b of the keyboard dock 114 includes a connection detection terminal 132b and a relay terminal 134b. The connection detection terminal 132b is connected to the connection detection terminal of the EC/KBC 140. The relay terminal 134b can be connected to a known level, a signal source, etc., for connection detection, and is grounded in FIG. 15. As described above, however, the relay terminal 134b may also be connected to the power supply Vcc, a predetermined voltage produced from the power supply Vcc and a predetermined signal source.

The tablet 112 includes a docking port 130b and a docking connector 120b. The docking port 130b includes a connection detention terminal 132a and a relay terminal 134a. The docking connector 120b includes a connection detection terminal 122b and a relay terminal 124b. The connection detection terminal 132a is connected to the connection detection terminal 122b. The relay terminal 134a it connected to the relay terminal 124b.

A smart phone 110 includes a docking port 120a. The docking port 120b includes a connection detection terminal 122a and a relay terminal 124a. The connection detection terminal 122a is connected to the relay terminal 124a via a signal line.

If the keyboard dock 114 and the tablet 112 are connected correctly to each other, the docking connector 130b of the keyboard dock 114 is electrically connected to the docking port 130b of the tablet 112, and the connection detection terminals 132b and 132a are connected to each other and the relay terminals 134b and 134a are connected to each other. If the smart phone 110 and toe tablet 112 are further connected correctly to each other, the docking connector 120b of the tablet 112 is electrically connected to the docking port 120a of the smart phone 110, and the connection detection terminals 122b and 122a are connected to each other and the relay terminals 124b and 134a are connected to each other.

If the keyboard dock 114, the tablet 112 and the smart phone 110 are correctly connected in series, the connection detection terminal of the EC/KBC 140 of the tablet 114 is grounded in the keyboard dock 114 via a circuit constituted by the connection detection terminals 132b, 132a, 122b and 122a, the connection line in the smart phone 110 and the relay terminals 124a, 124b, 134a and 134b. If at least one of the two connected portions is not correctly connected, the above circuit is not formed and the connection detection terminal or the EC/KBC 140 of the tablet 114 is pulled up to the power supply Vcc via the resistor 142. Therefore, the connection detection terminal is not at ground level. The connection detection of three or more apparatuses can also be executed in the same manner. Each of three or more apparatuses may be configured to detect the connection similarly to the case of two apparatuses, and may be modified as shown in FIG. 2 to FIG. 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A system comprising a first electronic apparatus and a second electronic apparatus, wherein
    the first electronic apparatus comprises a first connector,
    the second electronic apparatus comprises a second connector connectable to the first connector,
    the first connector comprises a first terminal, a second terminal and a third terminal,
    the second connector comprises a fourth terminal connectable to the first terminal, a fifth terminal connectable to the second terminal and a sixth terminal connectable to the third terminal,
    the second terminal and the third terminal are positioned at opposing ends of the first connector and connected to each other in the first electronic apparatus,
    the fifth terminal and the sixth terminal are positioned at opposing ends of the second connector,
    the fourth terminal and the fifth terminal are connected to each other in the second electronic apparatus,
    the sixth terminal is in a predetermined state,
    the first electronic apparatus comprises a first detector configured to detect a connection between the first electronic apparatus and the second electronic apparatus based on a state of the first terminal, and
    the second electronic apparatus comprises a second detector configured to detect a connection between the first electronic apparatus and the second electronic apparatus based on a state of the fourth terminal.

2. The system of claim 1, wherein the sixth terminal is configured to be connected to ground or to a power supply voltage via a first resistor in the second electronic apparatus.

3. A system comprising a first electronic apparatus and a second electronic apparatus, wherein
    the first electronic apparatus comprises a first connector,
    the second electronic apparatus comprises a second connector connectable to the first connector,
    the first connector comprises a first terminal, a second terminal and a third terminal,
    the second connector comprises a fourth terminal connectable to the first terminal, a fifth terminal connectable to the second terminal and a sixth terminal connectable to the third terminal,
    the second terminal and the third terminal are connected to each other in the first electronic apparatus,
    the fourth terminal and the fifth terminal are connected to each other in the second electronic apparatus,
    the sixth terminal is in a predetermined state,
    the first electronic apparatus comprises a first detector configured to detect a connection between the first electronic apparatus and the second electronic apparatus based on a state of the first terminal, and the second electronic apparatus comprises a second detector configured to detect a connection between the first electronic apparatus and the second electronic apparatus based on a state of the fourth terminal, wherein the first electronic apparatus comprises a first reverse-current prevention element between the first terminal and the first detector, and the second electronic apparatus comprises a second reverse-current prevention element between the fourth terminal and the second detector.

4. A system comprising a first electronic apparatus and a second electronic apparatus, wherein the first electronic apparatus comprises a first connector, the second electronic apparatus comprises a second connector connectable to the first connector, the first connector comprises a first terminal, a second terminal and a third terminal, the second connector comprises a fourth terminal connectable to the first terminal, a fifth terminal connectable to the second terminal and a sixth terminal connectable to the third terminal, the second terminal and the third terminal are connected to each other in the first electronic apparatus, the fourth terminal and the fifth terminal are connected to each other in the second electronic apparatus, the sixth terminal is in a predetermined state, the first electronic apparatus comprises a first detector configured to detect a connection between the first electronic apparatus and the second electronic apparatus based on a state of the first terminal, and the second electronic apparatus comprises a second detector configured to detect a connection between the first electronic apparatus and the second electronic apparatus based on a state of the fourth terminal, wherein the first terminal is configured to be connected to a power supply terminal or to a ground terminal via a resistor in the first electronic apparatus, and the fourth terminal is configured to be connected to a power supply terminal or to a ground terminal via a resistor in the second electronic apparatus.

5. The system of claim 1, wherein the predetermined state comprising any one of a ground voltage, a power supply voltage and a predetermined voltage obtained by dividing the power supply voltage.

6. The system of claim 1, wherein the first terminal and the second terminal are separately located and the fourth terminal and the fifth terminal are separately located.

* * * * *